(12) United States Patent
McLean

(10) Patent No.: US 6,491,528 B1
(45) Date of Patent: Dec. 10, 2002

(54) METHOD AND APPARATUS FOR VIBRATION AND TEMPERATURE ISOLATION

(75) Inventor: Harry W. McLean, North Bend, WA (US)

(73) Assignee: AT&T Wireless Services, Inc., Redmond, WA (US)

( * ) Notice: Subject to any disclaimer, the term of this patent is extended or adjusted under 35 U.S.C. 154(b) by 0 days.

(21) Appl. No.: 09/311,820

(22) Filed: May 13, 1999

Related U.S. Application Data

(60) Provisional application No. 60/113,927, filed on Dec. 24, 1998.

(51) Int. Cl.[7] ............... H05K 1/14; H05K 7/00; H05K 7/14
(52) U.S. Cl. ................ 439/76.1; 361/760
(58) Field of Search ............ 439/74, 76.1; 174/50–53; 361/724, 728, 737, 742, 760, 790, 796, 810

(56) References Cited

U.S. PATENT DOCUMENTS

| | | | | |
|---|---|---|---|---|
| 4,569,000 A | * | 2/1986 | Noji | 361/730 |
| 5,253,143 A | * | 10/1993 | Klinger et al. | 361/736 |
| 5,442,521 A | * | 8/1995 | Hirvonen et al. | 361/800 |
| 5,497,290 A | * | 3/1996 | Fukui et al. | 361/752 |
| 5,610,799 A | * | 3/1997 | Kato | 361/752 |
| 5,774,334 A | * | 6/1998 | Kawamura et al. | 361/699 |
| 6,097,612 A | * | 8/2000 | Ishikawa et al. | 361/794 |
| 6,147,869 A | * | 11/2000 | Furnival | 361/719 |
| 6,151,215 A | * | 11/2000 | Hoffman | 361/704 |
| 6,243,274 B1 | * | 6/2001 | Willis | 361/816 |
| 6,317,324 B1 | * | 11/2001 | Chen et al. | 361/704 |
| 6,322,375 B1 | * | 11/2001 | Cole et al. | 439/76.1 |

* cited by examiner

Primary Examiner—Tulsidas Patel
Assistant Examiner—Michael C. Zarroli
(74) Attorney, Agent, or Firm—Kenyon & Kenyon

(57) ABSTRACT

The method and apparatus of the present invention provide for isolation of one or more modules during stress testing of an overall system. The isolated modules remain in direct contact with elements exposed to the test by placing the modules in an isolation box and electrically connecting these modules to the remaining modules in the isolation box. The isolation box protects the weaker modules from vibration stresses as well as temperature and pressure stresses.

21 Claims, 3 Drawing Sheets

METHOD AND APPARATUS FOR VIBRATION AND TEMPERATURE ISOLATION

CONTINUATION DATA CLAIMED BY APPLICANTS

This application claims the benefit of U.S. Provisional Patent Application Serial No. 60/113,927 entitled "Method and Apparatus for Vibration and Temperature Isolation" and filed Dec. 24, 1998.

FIELD OF INVENTION

The present invention is directed to a method and apparatus for providing improved isolation for testing a subpart of a system. More specifically, the present invention is directed to a method and apparatus by which a modular component of a system can be at least partly isolated from stresses that are applied to the rest of the system as a part of a test.

BACKGROUND OF THE INVENTION

An important part of any attempt to deploy a newly designed system is the process of ascertaining whether the finally designed product will in fact operate at the required efficiencies and for a desired duration of time in the various physical environments in which it will be placed.

One technique by which devices are tested is to subject them to extreme temperature and vibration testing in a test chamber. The intent of the tests is to approximate what the expected life span of the device will be in its intended environment as well as to approximate the extreme environmental limits. Two commonly applied tests are the Highly Accelerated Life Test (HALT) and the Highly Accelerated Stress Screen (HASS). The HALT over stresses the device far beyond the intended end use environment looking for weaknesses and is commonly used during the design phase of a device. The HASS is similar to the HALT but is often used during the manufacturing phase as a screening test prior to installing the devices in the field.

One example of a system that would require such analysis is communications equipment, including wireless communications equipment, to be installed in the field. This type of equipment may include one or more circuit boards whose operation may be adversely affected by temperature and other environmental variables. In communications equipment, it is not uncommon for the system in question to include a plurality of modules or boards, some of which are more susceptible to damage in these tests than others. For example, one such "weaker" module might be a power supply board of a multi-circuit board system. The power supply might be a AC/DC converter that is known to be subject to failure if operated at a temperature outside he range of −10° to +80° C. or at a vibration of greater than 10 Grms (Gravity root mean square). However, the test conditions for the system using the power supply may be in the range of −70° to +90° C. and up to 29 Grms. For example, this can be desirable when testing more robust system components other than the module. Therefore, if the power supply is placed in the chamber with the rest of the system during such a test, it will likely fail and have a negative impact on the test of the rest of the system.

One solution to this problem is to place the weaker module outside the chamber in which the HALT or HASS tests are being applied. This has a drawback, however, as the electrical distance of separation between the module (outside the chamber) and the rest of the system (inside the chamber) may itself prevent the overall system from operating correctly. For example, in some systems, the electrical distance between components is important to timing (e.g., synchronization) between components. Also, this arrangement generally leads to unwieldy and complicated electrical interfaces between the module and the rest of the system, e.g., a separate wire must be run from each active pin on the module through the walls of the test chamber to the appropriate place in the rest of the system. It is therefore desirable to have a test chamber with the remainder of the system that is being subjected to testing.

SUMMARY OF THE INVENTION

The present invention provides a method and apparatus for substantially isolating a module from the rest of the system of which the module is a part. In particular, the present invention provides an isolation container ("box") it which a weaker module is disposed. One embodiment of the present invention comprises a box including damping elements so as to reduce the effect of vibration on the isolated module. In another embodiment, the box is equipped to receive compressed air that flows over the weaker module so as to maintain the module at an appropriate temperature. The box is designed to allow the module (e.g., a daughter board that plugs into a mother board) to be electrically connected to the rest of the system (e.g., the mother board with other modules) that is being subjected to the stress test. As used herein, the term "connect" is meant to encompass both direct and indirect connection. Thus A can be connected to B directly. Also A is "connected" to B if A is directly connected to C, and C is directly connected to B. A is "directly" connected to B if it sends signals through any medium from A to B. Thus, A can be directly connected to B via a wire, a soldered connection, an infrared link, an electromagnetic (e.g RF) link, etc.

One skilled in the art will understand that besides circuit boards for use in wireless communications, the invention can be used in other environments and should be understood to cover these other embodiments beyond those specifically described herein. For instance, certain system components include modules of varying strengths such that when the system is exposed to particular stress testing, one or more of the modules is at risk of failure or damage due to the stress testing.

DETAILED DESCRIPTION

The illustrative embodiments disclosed below speak in terms of a box, but it should be understood that a box can be any shape container which is able to enclose a weaker module.

One embodiment of the present invention has been designed for use with the testing of circuit boards for deployment in the field in establishing wireless communication systems.

Figure 1:
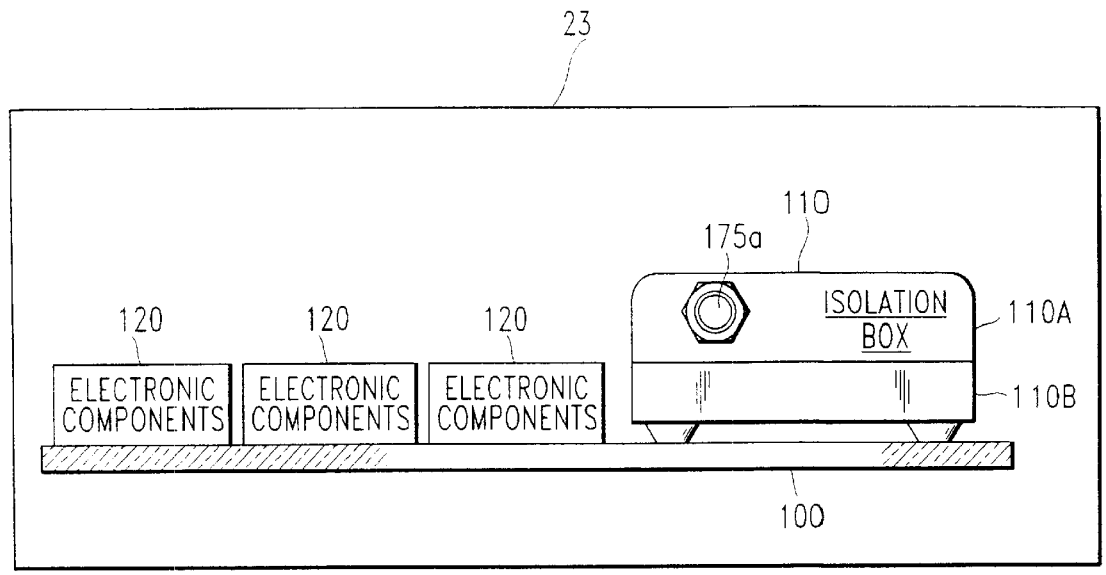
FIG. 1 shows a side view of an embodiment of the present invention.

FIG. 1 shows a side view of an embodiment of the present invention. In FIG. 1, a circuit board 100, also referred to as a mother board, has a plurality of electronic components 120 mounted thereon. The fact that the same reference numeral is applied to each of the components should not be considered an indication that all of those components are identical. This is simply used as a short-hand reference for the electrical components 120 themselves and can be meant to include any combination of memory chips, processors, capacitors, resistors, inductors or other electrical components which may be mounted on circuit board 100. The isolation box 110 also can be mounted on the board 100 prior to its insertion into an environmental chamber 23, such as a stress chamber.

The isolation box 110 comprises a first or top component 110A and a second or bottom component 110B, which are connected together in a manner which will also be described below. The isolation box encloses therein one or more modules, also referred to as daughter board(s), which are considered weaker and suspect with regard to the stress testing. Those modules can still be electrically connected to one or more elements on circuit board 100 via electrical connection port provided on the underside of isolation box 110. Those electrical connection ports are not illustrated in FIG. 1.

The box can have air ports 175a and 175b (only one of which is shown in FIG. 1). This permits a flow of compressed air across the surface of a board that is mounted inside the box 110 so as to maintain that board under the appropriate air temperature while the rest of the system is subjected to testing within the stress chamber. In order to control the air temperature, inlet air port 175a could be connected to a compressor with a low air volume at or below room temperature.

Figure 2:
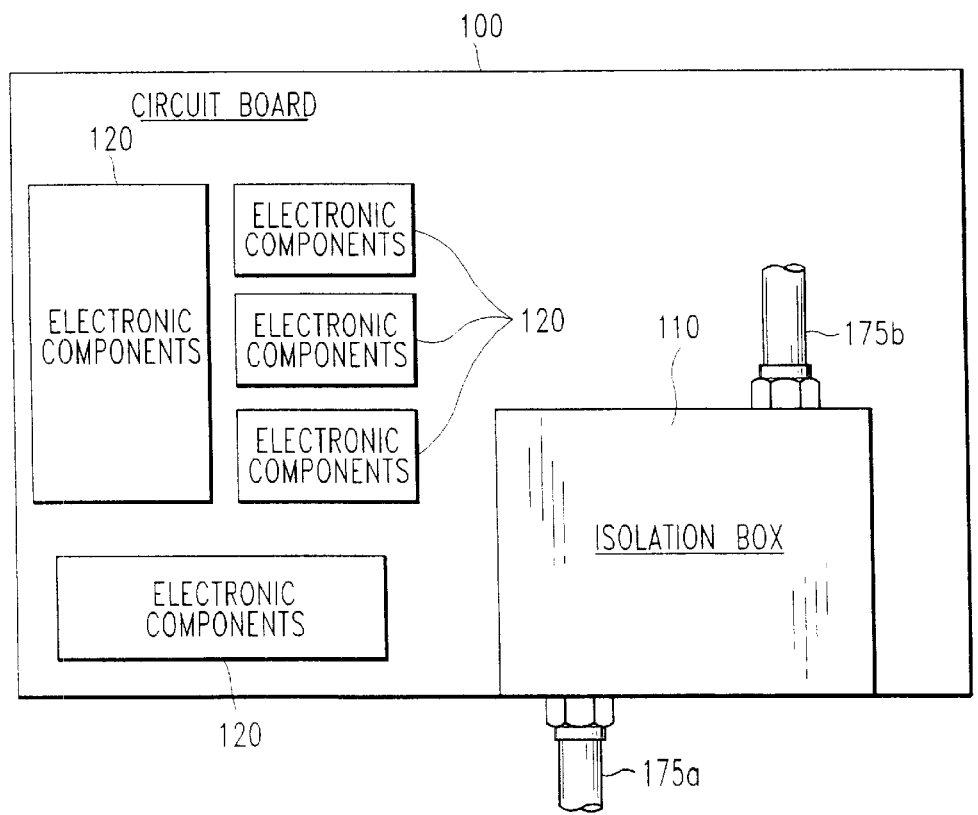
FIG. 2 illustrates a top view of an embodiment of the present invention.

FIG. 2 illustrates a top view of an embodiment of the present invention on a circuit board. Again, circuit board 100 is shown with a plurality of electronic elements 120. Furthermore, the isolation box 110 is shown with air ports 175a and 175b both visible. As can be seen, the ports are positioned to expose most of the inside of isolation box 110 to the flow of air, reducing the likelihood that the weaker module would be subjected to a substantial temperature gradient within the box. This entire assembly can be inserted within the environmental chamber, and the isolation box, based on its construction as described below, provides vibration damping for the weaker module as well as atmospheric/temperature protection so that this weaker module will continue to operate in an appropriate fashion even when disposed within the stress chamber.

Figure 3:
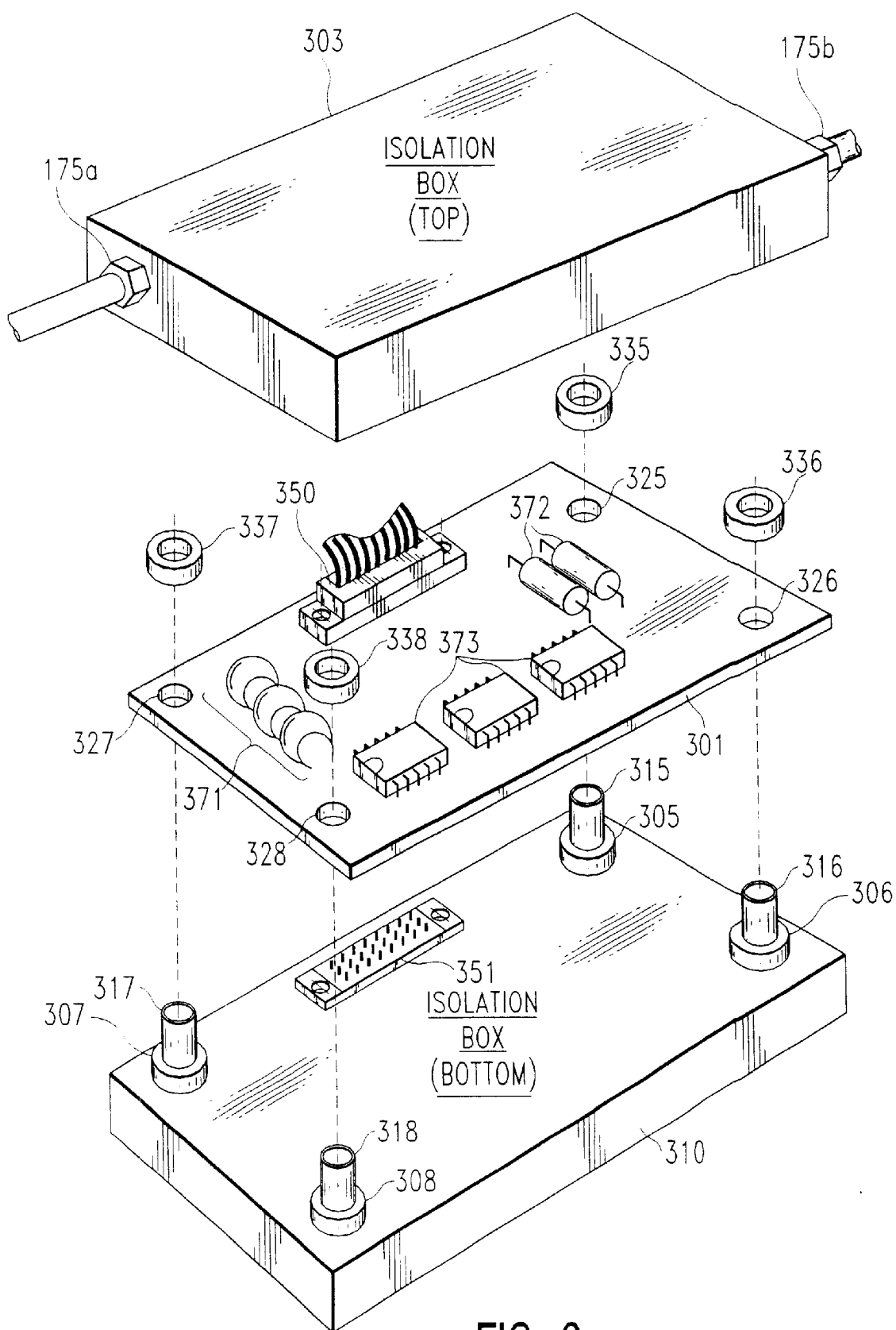
FIG. 3 illustrates an exploded view of an embodiment of the present invention.

FIG. 3 illustrates an exploded view of the system in accordance with an embodiment of the present invention. The isolation box is shown in two separate portions, top portion 303 and bottom portion 310. These portions can be made of a material that will withstand the stress to be applied by the test, i.e., the testing temperature range and vibration maximum. Examples of such materials include DERLIN and ULTEM, both available from DuPont, or mumetal, which would also shield the weaker module from Electromagnetic Interference ("EMI").The weaker module is shown as component 301. This is a smaller circuit board which can have a plurality of electrical components mounted thereon, for example, components 371, 372 and 373. Just as with electrical components 120 described above, these components mounted on the weaker module can include a myriad of electrical components and the reference numerology should not be taken as an attempt to divide the components into only three different types. Also shown on the weaker module 301 is a connector component 350 which allows for a pin or multi-pin connection between the electrical components on board 301 and one or more electrical components on board 100 in FIGS. 1 and 2. The connection can be by direct or indirect coupling and also could be achieved by infrared ("IR") coupling, magnetic coupling, a header-multi-pin connector with ribbon cable, a wire or multi-conductor cable interconnection, a terminal strip with screws or similar coupling mechanisms. The module 301 has four apertures 325, 326, 327 and 328 which are used for mounting the board within the isolation box. The number of apertures is variable so long as the number of apertures provided for mounting enables a secure mounting of the module within the isolation box.

In this example, the module is mounted on fasteners 315, 316, 317 and 318. These fasteners can include screws, posts, snap-in circuit board spacers, an any other type of fasteners which would act to stabilize the module 301 within the isolation chamber and prevent it shifting from side to side or twisting. A plurality af spacers, 305, 306, 307 and 308 are also mounted on these posts and positioned between the bottom portion 310 and the board 301. These spacers act as a vibration damping mechanism and can include, for instance, rubber grommets, fiber washers, shoulder washers, or other rubber or elastomer material. The chosen spacers should provide appropriate levels of vibration damping. The bottom portion of the isolation box also includes one or more apertures, here shown collectively as 351, for permitting access to the connector 350 from outside of the isolation box. Thus, as a plurality of pins may be disposed on the top surface of board 100 for connection with the module 301, those pins can pass through the apertures 351 and come into contact with the connector 350 even while the module is in isolation in the isolation box.

Figure 4:
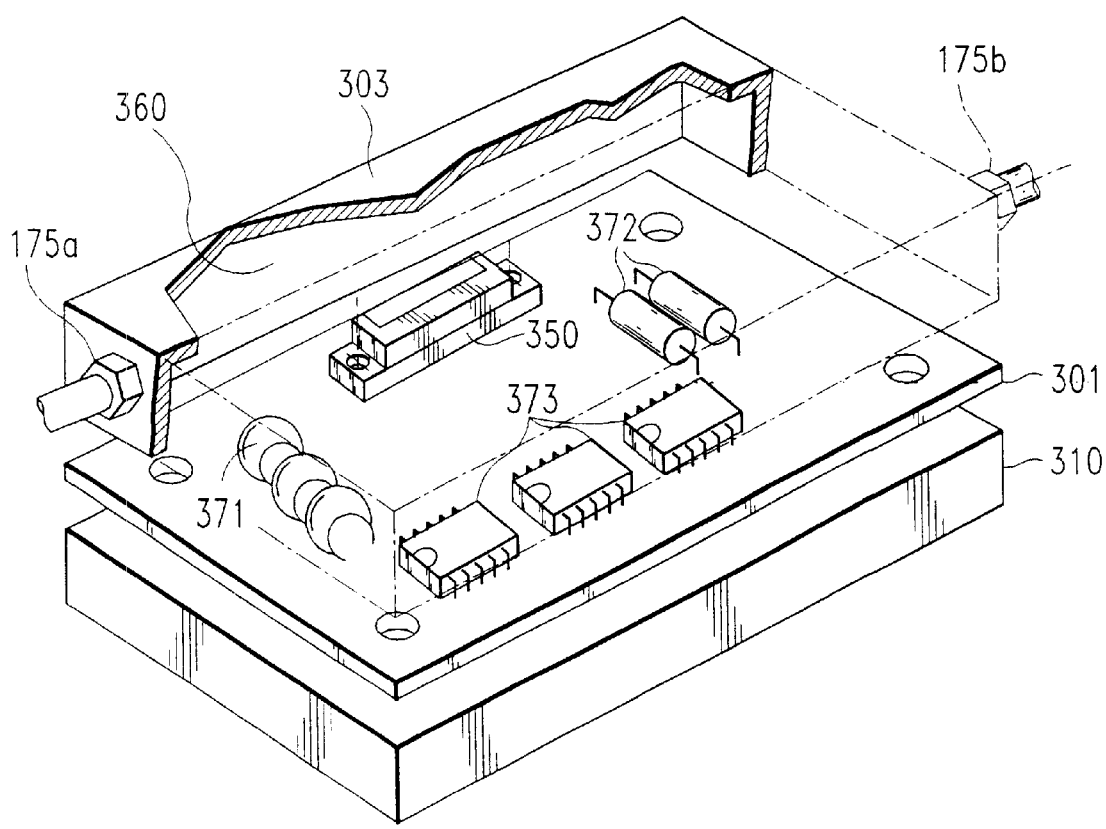
FIG. 4 illustrates an exploded view of an embodiment of the present invention with a cavity.

A plurality of additional spacers, 335, 336, 337 and 338 are then mounted on the posts above the module 301 and between the module and the top portion of the box 303. These spacers can be made of the same material as the spacers disposed below a module and also play a role in vibration damping. The posts 315, 316, 317 and 318 are secured into openings on the bottom side of the top portion of 303, that is, the surface of top portion 303 that faces the module 301. In addition, as seen in FIG. 4, one portion of the isolation box may include a cavity portion 360 so as to accommodate this electrical components of module 301. This cavity also provides an open space for the compressed air flow entering through air port 175a and exiting via air port 175b. The compressed air which flows through the two ports and through the cavity disposed above module 301 permits a stable temperature of the components mounted on that module and the maintenance of an appropriate pressure on those elements even while the entire structure is submitted to environmental testing in the stress chamber.

Different size boxes can be used to accommodate different sized modules. Alternatively, an internal cavity could be adapted to hold different sized modules. Also, the box could be designed to accommodate multiple modules, such as in stacked configuration separated by spacers or other separators or in a side by side configuration.

The isolation box can be used in stress tests which vary such environmental parameters as temperature, temperature shock, vibration, EMI interference (used as a shield) and humidity. Example ranges for these parameters include: approximately −100° C. to 200° C. for temperature, approximately 60° C. or greater for temperature shock, approximately up to 50 Grms for vibration, and approximately 85° C. at 85% relative humidity for 165 hours for humidity. To isolate the weaker module in a himidity test, hermetic seals would have to be added to the isolation box.

The present invention thereby provides a method and apparatus by which one or more modules can be isolated from the negative effects of a stress test while still being electrically connected to other elements that are being subjected to the test as the overall configuration is placed in a testing chamber. This avoids the problem with prior art solutions which attempt to isolate weaker modules by keeping those modules out of the testing chamber all together.

While the present invention is described with respect to specific embodiments, these embodiments are not intended to limit the scope of the invention, which is defined by the appended claims.

What is claimed is:

1. An apparatus for isolating a board of a multi-board system, comprising:
   a first board; and
   an isolation box comprising a first portion and a second portion, wherein the first portion and the second portion couple to form a box with an internal cavity; and
   wherein said first board is enclosed within the cavity of the isolation box and isolated from a second board, and wherein the second board is outside the box,
   the isolation box further comprising vibration dampeners, wherein the vibration dampeners are selected from the group consisting of rubber grommets, fiber washers, shoulder washers, and combinations thereof.

2. An apparatus for isolating a daughter board adapted to be electrically coupled to a mother board, comprising:
   a first isolation component defining an open cavity adapted to receive the daughter board;
   a second isolation component adapted to seal the open cavity to form an isolation box;
   an electronic interface provided on said box, said electronic interface adapted to convey electrical signals between the daughter board and the mother board, and wherein the daughter board and the mother board are isolated from each other by the isolation box.

3. The apparatus for isolating the daughter board according to claim 2, wherein the isolation box includes fasteners to secure the daughter board.

4. The apparatus for isolating the daughter board according to claim 2, wherein the isolation box includes vibration dampeners to lessen the vibration within the isolation box.

5. The apparatus for isolating the daughter board according to claim 3, wherein the fasteners are selected from the group consisting of screws, posts, snap-in spacers, and combinations thereof.

6. The apparatus for isolating the daughter board according to claim 4, wherein the vibration dampeners are selected from the group consisting of rubber grommets, fiber washers, shoulder washers, and combinations thereof.

7. The apparatus for isolating the daughter board according to claim 2, wherein the isolation box includes an air port.

8. An apparatus for isolating a daughter board adapted to be electrically coupled to a mother board comprising an enclosure adapted to substantially environmentally isolate the daughter board from the mother board, said enclosure provided with an electronic interface adapted to convey electrical signals between the substantially environmentally isolated daughter board and the mother board, and wherein the mother board is outside said enclosure.

9. The apparatus of claim 8, further comprising a physical port for the introduction of a fluid into said enclosure.

10. The apparatus of claim 9, wherein the fluid is a gas.

11. The apparatus of claim 9, wherein the fluid is temperature controlled.

12. The apparatus of claim 9, wherein the fluid is a liquid.

13. The apparatus of claim 8, wherein the electronic interface is selected from the group consisting of a socket, an electromagnetic connection, and a magnetic interface.

14. The apparatus for isolating the daughter board according to claim 2, wherein the electrical connection between the daughter board and the mother board is selected from the connection systems consisting of a pin connector, a multi-pin connector, IR coupling, magnetic coupling, a header-multi-pin connector with a ribbon cable, a wire or multi-conductor cable interconnector, and a terminal strip with screws.

15. The apparatus for isolating the daughter board according to claim 2, wherein the entire apparatus is inserted within another environment chamber.

16. The apparatus for isolating the daughter board according to claim 2, wherein the entire apparatus is inserted within another environment chamber and wherein a fluid is provided inside the isolation box to provide atmospheric/temperature protection to the daughter board inside the isolation box.

17. An apparatus for isolating a board of a multi-board system, comprising:
   a first board; and
   an isolation box comprising a first portion and a second portion, wherein the first portion and the second portion couple to form a box with an internal cavity; and
   wherein said first board is enclosed within the cavity of the isolation box and isolated from a second board, and wherein the second board is outside the box,
   wherein the entire apparatus is inserted within another environment chamber and wherein a fluid is provided inside the isolation box to provide atmospheric/temperature protection to the first board inside the isolation box.

18. An apparatus for testing a multi-board system, comprising:
   a first board;
   a second board;
   an isolation box, wherein said first board is enclosed within the isolation box and physically isolated from the second board, and wherein the second board is outside the isolation box and electrically connected to the first board;
   a testing chamber containing said second board and said isolation box to conduct testing on said first board and said second board.

19. The apparatus for testing a multi-board system according to claim 18, wherein a fluid is provided inside the isolation box to provide atmospheric and/or temperature protection to the first board inside the isolation box.

20. The apparatus for testing a multi-board system according to claim 18, wherein the electrical connection between the first board and the second board is selected from the connection systems consisting of a pin connector, a multi-pin connector, IR coupling, magnetic coupling, a header-multi-pin connector with a ribbon cable, a wire or multi-conductor cable interconnector, and a terminal strip with screws.

21. The apparatus for testing a multi-board system according to claim 18, wherein the testing is done in the range of between −70° C. and +90° C. and up to 29 Grms (Gravity root mean square).

* * * * *

UNITED STATES PATENT AND TRADEMARK OFFICE
Certificate

Patent No. 6,491,528 B1                                                                                       Patented: December 10, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Harry W. McLean, North Bend, WA; Joseph Ellison, Tucson, AZ; Jason Gardner, Kirkland, WA; and Ryan Leland, Fall City, WA Signed and Sealed this Third Day of June 2003.

LYNN FIELD
*Supervisory Patent Examiner*
Art Unit 2839